United States Patent
Hong et al.

(10) Patent No.: US 12,149,070 B2
(45) Date of Patent: Nov. 19, 2024

(54) DECENTRALIZED FALSE DATA MITIGATION FOR NESTED MICROGRIDS

(71) Applicants: HITACHI ENERGY LTD, Zürich (CH); ABB Schweiz AG, Baden (CN)

(72) Inventors: Junho Hong, Cary, NC (US); Dmitry Ishchenko, Cary, NC (US); Reynaldo Nuqui, Cary, NC (US)

(73) Assignee: Hitachi Energy Ltd., Zurich (CH)

( * ) Notice: Subject to any disclaimer, the term of this patent is extended or adjusted under 35 U.S.C. 154(b) by 649 days.

(21) Appl. No.: 16/147,979

(22) Filed: Oct. 1, 2018

(65) Prior Publication Data

US 2020/0106301 A1  Apr. 2, 2020

(51) Int. Cl.
*H02J 13/00* (2006.01)
*G01R 22/06* (2006.01)
(Continued)

(52) U.S. Cl.
CPC ...... *H02J 13/00002* (2020.01); *G01R 22/066* (2013.01); *G06F 30/18* (2020.01);
(Continued)

(58) Field of Classification Search
CPC ............... H02J 13/0079; H02J 2203/20; H02J 2310/10; H02J 13/00002; H02J 13/00016;
(Continued)

(56) References Cited

U.S. PATENT DOCUMENTS

| | | |
|---|---|---|
| 10,372,569 B2 | 8/2019 | Premerlani et al. |
| 2014/0032187 A1 | 1/2014 | Legbedji et al. |

(Continued)

FOREIGN PATENT DOCUMENTS

| | | |
|---|---|---|
| CN | 102522743 A | 6/2012 |
| CN | 103034787 A | 4/2013 |

(Continued)

OTHER PUBLICATIONS

Beg, Omar Ali, Taylor T. Johnson, and Ali Davoudi. "Detection of false-data injection attacks in cyber-physical DC microgrids." IEEE Transactions on industrial informatics 13.5 (2017): 2693-2703.*
Zhang, Heng, et al. "Distributed load sharing under false data injection attack in an inverter-based microgrid." IEEE Transactions on Industrial Electronics 66.2 (2018): 1543-1551.*

(Continued)

*Primary Examiner* — Boris Gorney
*Assistant Examiner* — David A Hopkins
(74) *Attorney, Agent, or Firm* — Slater Matsil, LLP

(57) ABSTRACT

Systems, methods, techniques and apparatuses of nested microgrids are disclosed. One exemplary embodiment is a method for removing false data in a nested microgrid system, the method comprising: calculating a first local state estimation using a first plurality of local measurements and a second local state estimation using a second plurality of local measurements; calculating, with a central control system, a plurality of global state estimations including a first global state estimation a second global state estimation; performing a first false data detection test using the first local state estimation and one global state estimation of the plurality of global state estimations; performing a second false data detection test using the first global state estimation and the second global state estimation; detecting false data; and updating the first global state estimation, the second global state estimation, or the first local state estimation in response to detecting the false data.

18 Claims, 4 Drawing Sheets

(51) Int. Cl.
G06F 30/18 (2020.01)
G06F 30/20 (2020.01)

(52) U.S. Cl.
CPC ........ *G06F 30/20* (2020.01); *H02J 13/00016* (2020.01); *H02J 13/00022* (2020.01); *H02J 2203/20* (2020.01)

(58) Field of Classification Search
CPC ............. H02J 13/00022; G01R 22/066; Y02E 60/7853; Y02E 60/7838; Y02E 60/00; Y04S 40/126; Y04S 40/124; G06F 30/18; G06F 30/23; G06F 2111/20; G06F 2111/10; G06F 30/20
See application file for complete search history.

(56) References Cited

U.S. PATENT DOCUMENTS

| | | | |
|---|---|---|---|
| 2014/0129204 A1* | 5/2014 | Britton | G06N 20/00 703/18 |
| 2015/0295409 A1 | 10/2015 | Zhang et al. | |
| 2017/0331842 A1 | 11/2017 | Kikuchi | |
| 2017/0353031 A1* | 12/2017 | Sun | H02J 3/18 |
| 2019/0004490 A1* | 1/2019 | Becher | G05B 19/048 |
| 2019/0253440 A1* | 8/2019 | Mathur | H04L 63/1416 |

FOREIGN PATENT DOCUMENTS

| | | |
|---|---|---|
| CN | 103972888 B | 10/2015 |
| JP | 2017204722 A | 11/2017 |
| JP | 2018032382 A | 3/2018 |
| WO | 2016176682 A1 | 11/2016 |
| WO | 2018048351 A1 | 3/2018 |

OTHER PUBLICATIONS

Wang, Shaocheng, and Wei Ren. "Stealthy false data injection attacks against state estimation in power systems: Switching network topologies." 2014 American Control Conference. IEEE, 2014.*
Feng, Yangyue, et al. "Malicious false data injection in hierarchical electric power grid state estimation systems." Proceedings of the fourth international conference on Future energy systems. 2013. (Year: 2013).*
Zonouz, Saman, et al. "SCPSE: Security-oriented cyber-physical state estimation for power grid critical infrastructures." IEEE Transactions on Smart Grid 3.4 (2012): 1790-1799. (Year: 2012).*
Yang, Tao, Hongbin Sun, and Anjan Bose. "Transition to a two-level linear state estimator—Part I: Architecture." IEEE Transactions on Power Systems 26.1 (2010): 46-53. (Year: 2010).*
Mi, Shichao, et al. "A secure scheme for distributed consensus estimation against data falsification in heterogeneous wireless sensor networks." Sensors 16.2 (2016): 252. (Year: 2016).*
Zimmer, Christopher, and Frank Mueller. "Fault tolerant network routing through software overlays for intelligent power grids." 2010 IEEE 16th International Conference on Parallel and Distributed Systems. IEEE, 2010. (Year: 2010).*
Kezunovic, Mladen. "Monitoring of power system topology in real-time." Proceedings of the 39th Annual Hawaii International Conference on System Sciences (HICSS'06). vol. 10. IEEE, 2006. (Year: 2006).*
Baiocco, Alessio, et al. "A model for robust distributed hierarchical electric power grid state estimation." ISGT 2014. IEEE, 2014. (Year: 2014).*
Choi, Dae-Hyun, and Le Xie. "Fully distributed bad data processing for wide area state estimation." 2011 IEEE International Conference on Smart Grid Communications (SmartGridComm). IEEE, 2011. (Year: 2011).*
Van Cutsem, Th, Jean-Luc Horward, and M. Ribbens-Pavella. "A two-level static state estimator for electric power systems." IEEE transactions on power apparatus and systems 8 (1981): 3722-3732. (Year: 1981).*

Gomez-Exposito, Antonio, and Antonio de la Villa Jaen. "Two-level state estimation with local measurement pre-processing." IEEE Transactions on Power Systems 24.2 (2009): 676-684. (Year: 2009).*
Kurt, Mehmet Necip, Yasin Ylmaz, and Xiaodong Wang. "Distributed quickest detection of cyber-attacks in smart grid." IEEE Transactions on Information Forensics and Security 13.8 (2018): 2015-2030. (Year: 2018).*
Liu, Yao, Peng Ning, and Michael K. Reiter. "False data injection attacks against state estimation in electric power grids." ACM Transactions on Information and System Security (TISSEC) 14.1 (2011): 1-33. (Year: 2011).*
Nguyen, P. H., and W. L. Kling. "Distributed state estimation for multi-agent based active distribution networks." IEEE PES General Meeting. IEEE, 2010. (Year: 2010).*
Patel, M. Y., and A. A. Girgis. "Two-level state estimation for multi-area power system." 2007 IEEE Power Engineering Society General Meeting. IEEE, 2007. (Year: 2007).*
Da Silva, N. S., et al. "Simultaneous estimation of state variables and network topology for power system real-time modeling." Electric Power Systems Research 133 (2016): 338-346. (Year: 2016).*
Stanković, Srdjan, et al. "Consensus based overlapping decentralized fault detection and isolation." 2010 Conference on Control and Fault-Tolerant Systems (SysTol). IEEE, 2010. (Year: 2010).*
Vuković, Ognjen, and György Dán. "Security of fully distributed power system state estimation: Detection and mitigation of data integrity attacks." IEEE Journal on Selected Areas in Communications 32.7 (2014): 1500-1508. (Year: 2014).*
Weng, Yang, et al. "Robust data-driven state estimation for smart grid." IEEE Transactions on Smart Grid 8.4 (2016): 1956-1967. (Year: 2016).*
Wu, Felix F., and W-He Liu. "Detection of topology errors by state estimation (power systems)." IEEE Transactions on Power Systems 4.1 (1989): 176-183. (Year: 1989).*
Bose, "Phasor Measurements for Blackout Prevention", Feb. 2013, Slideshow Presentation, URL: www(dot)naspi(dot)org/sites/default/files/2016-09/bose_blackout_prevention_panel_20130221(dot)pdf. (Year: 2013).*
Chen, Heng, et al. "Synchrophasor-based real-time state estimation and situational awareness system for power system operation." Journal of Modern Power Systems and Clean Energy 4.3 (2016): 370-382. (Year: 2016).*
Gomez-Exposito, Antonio, et al. "A multilevel state estimation paradigm for smart grids." Proceedings of the IEEE 99.6 (2011): 952-976 (Year: 2011).*
Gustavo Adolfo Valverde Mora, "Uncertainty and State Estimation of Power Systems", PhD Dissertation, The University of Manchester, 2012 (Year: 2012).*
Yang, Tao, Hongbin Sun, and Anjan Bose. "Transition to a two-level linear state estimator—Part II: Algorithm." IEEE Transactions on Power Systems 26.1 (2010): 54-62 (Year: 2010).*
Kekatos, Vassilis, and Georgios B. Giannakis. "Distributed robust power system state estimation." IEEE Transactions on Power Systems 28.2 (2012): 1617-1626. (Year: 2012).*
Akkaya, Kemal, A. Selcuk Uluagac, and Abdullah Aydeger. "Software defined networking for wireless local networks in smart grid." 2015 IEEE 40th Local Computer Networks Conference Workshops (LCN Workshops). IEEE, 2015. (Year: 2015).*
Ayala, Luis, and Luis Ayala. "Detection of Cyber-Attacks." Cybersecurity for Hospitals and Healthcare Facilities: A Guide to Detection and Prevention (2016): 53-60. Chapter 6, p. 56 (Year: 2016).*
Aydeger, Abdullah, et al. "Software defined networking for resilient communications in smart grid active distribution networks." 2016 IEEE International Conference on Communications (ICC). IEEE, 2016. (Year: 2016).*
Baah et al., "A Study of Gaps in Cyber Defense Automation", Technical Report 1194, Oct. 2016, see § 2 (Year: 2016).*
Dorsch, Nils, Fabian Kurtz, and Christian Wietfeld. "On the economic benefits of software-defined networking and network slicing for smart grid communications." Netnomics: Economic Research and Electronic Networking 19.1 (2018): 1-30. (Year: 2018).*
Broadband Internet Technical Advisory Group (BITAG), Port Blocking (2013) (Year: 2013).*

(56) References Cited

OTHER PUBLICATIONS

Jararweh, Yaser, et al. "Software Defined based smart grid architecture." 2015 IEEE/ACS 12th International Conference of Computer Systems and Applications (AICCSA). IEEE, 2015. (Year: 2015).*
Kesler, Brent. "The vulnerability of nuclear facilities to cyber attack; strategic insights: Spring 2010." Strategic Insights, Spring 2011 (2011). p. 19 (Year: 2011).*
Patra, Subhashree, and K. S. Swarup. "Comprehensive Study on Central Control Management of a Power Distribution System." Power Research—A Journal of CPRI (2012): 153-162. (Year: 2012).*
Ranathunga, Dinesha Prasanna. Auto-configuration of critical network infrastructure. Diss. 2017. p. 13 and § 8.1 (Year: 2017).*
Roy, Rajib Baran. "Application of SCADA for controlling electrical power system network." UITS J 1.2 (2003): 85-97. Abstract and p. 93 ¶ 1 (Year: 2003).*
Patent Cooperation Treaty, International Search Report and Written Opinion in corresponding application No. PCT/US19/54040, dated Jan. 2, 2020, 7 pp.
Lin et al., "An Implementable Distributed State Estimator and Distributed Bad Data Processing Schemes for Electric Power Systems," IEEE Transactions on Power Systems, vol. 9, No. 3, Aug. 1994, 8 pages.

* cited by examiner

DECENTRALIZED FALSE DATA MITIGATION FOR NESTED MICROGRIDS

STATEMENT REGARDING FEDERALLY SPONSORED RESEARCH OR DEVELOPMENT

This invention was made with U.S. Government support under Contract No. DE-FOA-0001441 awarded by the Department of Energy. The Government has certain rights in this invention.

BACKGROUND

The present disclosure relates generally to nested microgrids, which are interconnected portions of a power network including at least one power source and one load capable of operating independently if disconnected from the rest of the power network. State estimation in a nested microgrid system enables online monitoring and network awareness. Accurate state estimation in nested microgrids depends on accurate data from field devices. Due to a field device failure or external communication channel interference, microgrid communication channels may communicate false data to a state estimator. When there are too many faulty field devices or false data injection attacks, state estimation will indicate an inaccurate system topology or system status. Detecting false data is necessary to prevent damage to microgrid components or cascading failure of a power network.

SUMMARY OF THE DISCLOSURE

Exemplary embodiments of the disclosure include unique systems, methods, techniques and apparatuses for nested microgrids. Further embodiments, forms, objects, features, advantages, aspects and benefits of the disclosure shall become apparent from the following description and drawings.

DETAILED DESCRIPTION OF ILLUSTRATIVE EMBODIMENTS

Figure 1:
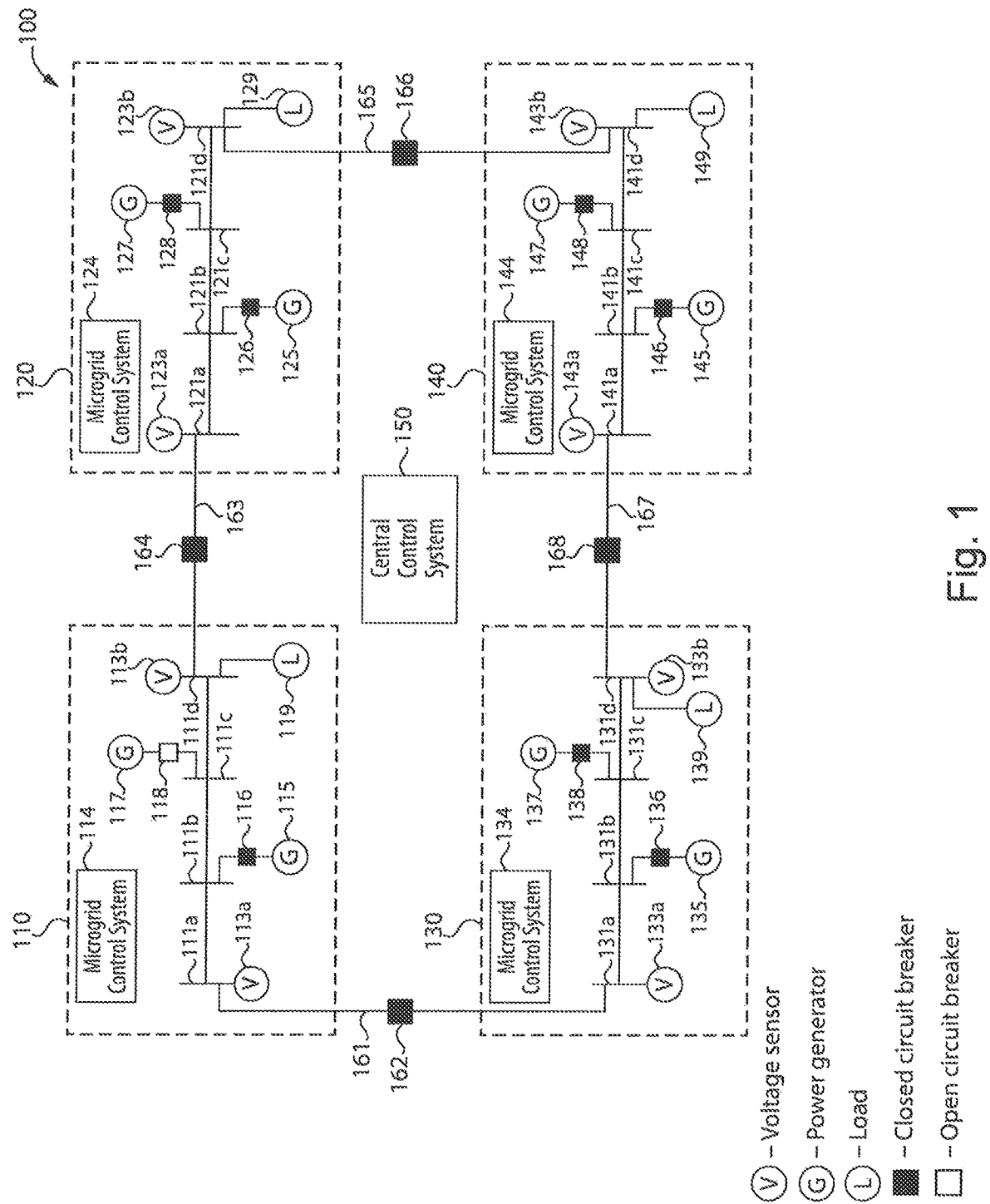
FIG. 1 is a circuit diagram illustrating an exemplary nested microgrid system.

With reference to FIG. 1, there is illustrated a nested microgrid system 100 structured to detect false data in a microgrid state estimation using multi-layered state estimation executed at both a microgrid and central control system level. It shall be appreciated that system 100 may be implemented in a variety of applications, including utility grid distribution systems, industrial plant distribution systems, and vehicular distribution systems, to name but a few examples. It shall be appreciated that the topology of system 100 is illustrated for the purpose of explanation and is not intended as a limitation of the present disclosure. For example, system 100 may include more or fewer microgrids and the microgrids of system 100 may be arranged in any configuration as long as each microgrid is coupled to at least one other microgrid. Furthermore, it shall be appreciated that the topology of each microgrid is illustrated for the purpose of explanation and is not intended as a limitation of the present disclosure. For example, microgrid 110 may include more or fewer buses, more or fewer power sources, more loads, and more or fewer field devices. Although system 100 is illustrated with a single line diagram, system 100 may be structured to transmit single-phase alternating current (AC) power, multiphase AC power, or direct current (DC) power.

System 100 includes microgrids 110, 120, 130, and 140 coupled by way of connection lines 161, 163, 165, and 167. Specifically, microgrid 110 is coupled to microgrid 120 by way of connection line 163; microgrid 120 is coupled to microgrid 130 by way of connection line 165; microgrid 130 is coupled to microgrid 140 by way of connection line 167; and microgrid 140 is coupled to microgrid 110 by way of connection line 161. In certain embodiments, system 100 is coupled to a portion of a utility grid.

A tie breaker 162, also known as a circuit breaker, is operatively coupled to connection line 161 and structured to selectively interrupt the flow of current through connection line 161. A tie breaker 164 is operatively coupled to connection line 163 and structured to selectively interrupt the flow of current through connection line 163. A tie breaker 166 is operatively coupled to connection line 165 and structured to selectively interrupt the flow of current through connection line 165. A tie breaker 168 is operatively coupled to connection line 167 and structured to selectively interrupt the flow of current through connection line 167.

Microgrid 110 is structured to supply power to microgrid loads, such as load 119, whether connected to other nested microgrids or disconnected from the remainder of system 100. Microgrid 110 includes a point of interconnection (POI), also known as a point of common connection, bus 111a coupled between connection line 161 and bus 111b, a bus 111c coupled to bus 111b, and a POI bus 111d coupled between bus 111c and connection line 163. Microgrid 110 also includes a plurality of field devices structured to measure electrical or physical characteristics of microgrid 110 including voltage sensor 113a and voltage sensor 113b. Voltage sensor 113a is coupled to POI bus 111a and structured to measure the voltage of POI bus 111a. Voltage sensor 113b is coupled to POI bus 111d and structured to measure the voltage of POI bus 111d. In certain embodiments, microgrid 110 includes additional voltage sensors or other types of field devices, such as remote terminal units (RTUs), intelligent electronic devices (LEDs), relays, reclosers, phasor measurement units (PMUs), current sensors, voltage transformers, and current transformers, to name but a few examples. In certain embodiments, voltage sensors are structured to measure a voltage magnitude and voltage phase angle and current sensors are structured to measure a current magnitude and current phase angle.

Microgrid 110 includes power source 115 coupled to bus 111b and power source 117 coupled to bus 111c. Power sources 115 and 117 may include a solar panel array, a wind turbine, a natural gas generator, or any other system structured to generate power. Power source 115 is coupled to bus 111b by way of a circuit breaker 116, also known as a switching device, structured to selectively interrupt current flowing between bus 111b and power source 115. Power source 117 is coupled to bus 111c and structured to selectively interrupt current flowing between bus 111c and power source 117.

Microgrid 110 includes a microgrid control system 114 structured to communicate with the field devices including circuit breakers of microgrid 110, perform state estimation, and perform false data detection and mitigation, as explained in more detail below. In certain embodiments, microgrid control system 114 is structured to control and receive measurements from tie breakers adjacent to microgrid 110. It shall be appreciated that any or all of the foregoing features of microgrid 110 may also be present in the other microgrids of system 100 disclosed herein.

Microgrid 120 is structured to supply power to coupled loads, such as load 129, whether connected to other microgrids or disconnected from the remainder of system 100. Microgrid 120 includes a POI bus 121a coupled between connection line 163 and bus 121b, a bus 121c coupled to bus 121b, and a POI bus 121d coupled between bus 121c and connection line 163. Microgrid 120 also includes a plurality of field devices structured to measure electrical or physical characteristics of microgrid 120 including voltage sensor 123a and voltage sensor 123b. Voltage sensor 123a is coupled to POI bus 121a and structured to measure the voltage of POI bus 121a. Voltage sensor 123b is coupled to POI bus 121d and structured to measure the voltage of POI bus 121d.

Microgrid 120 includes power source 125 coupled to bus 121b and power source 127 coupled to bus 121c. Power source 125 is coupled to bus 121b by way of a circuit breaker 126 structured to selectively interrupt current flowing between bus 121b and power source 125. Power source 127 is coupled to bus 121c and structured to selectively interrupt current flowing between bus 121c and power source 127. Microgrid 120 includes a microgrid control system 124 structured to communicate with the field devices and circuit breakers of microgrid 120 and conduct false data detection and mitigation, as explained in more detail below.

Microgrid 130 is structured to supply power to coupled loads, such as load 139, whether connected to other microgrids or disconnected from the remainder of system 100. Microgrid 130 includes POI bus 131a coupled between connection line 161 and bus 131b, a bus 131c coupled to bus 131b, and a POI bus 131d coupled between bus 131c and connection line 163. Microgrid 130 also includes a plurality of field devices structured to measure electrical or physical characteristics of microgrid 130 including voltage sensor 133a and voltage sensor 133b. Voltage sensor 133a is coupled to POI bus 131a and structured to measure the voltage of POI bus 131a. Voltage sensor 133b is coupled to POI bus 131d and structured to measure the voltage of POI bus 131d.

Microgrid 130 includes power source 135 coupled to bus 131b and power source 137 coupled to bus 131c. Power source 135 is coupled to bus 131b by way of a circuit breaker 136 structured to selectively interrupt current flowing between bus 131b and power source 135. Power source 137 is coupled to bus 131c and structured to selectively interrupt current flowing between bus 131c and power source 137. Microgrid 130 includes a microgrid control system 134 structured to communicate with the field devices and circuit breakers of microgrid 130 and conduct false data detection and mitigation, as explained in more detail below.

Microgrid 140 is structured to supply power to coupled loads, such as load 149, whether connected to other microgrids or disconnected from the remainder of system 100. Microgrid 140 includes a POI bus 141a coupled to bus 141b, a bus 141c coupled to bus 141b, and a POI bus 141d coupled between bus 141c and connection line 163. Microgrid 140 also includes a plurality of field devices structured to measure electrical or physical characteristics of microgrid 140 including voltage sensor 143a and voltage sensor 143b. Voltage sensor 143a is coupled to POI bus 141a and structured to measure the voltage of POI bus 141a. Voltage sensor 143b is coupled to POI bus 141d and structured to measure the voltage of POI bus 141d.

Microgrid 140 includes power source 145 coupled to bus 141b and power source 147 coupled to bus 141c. Power source 145 is coupled to bus 141b by way of a circuit breaker 146 structured to selectively interrupt current flowing between bus 141b and power source 145. Power source 147 is coupled to bus 141c and structured to selectively interrupt current flowing between bus 141c and power source 147. Microgrid 140 includes a microgrid control system 144 structured to communicate with the field devices and circuit breakers of microgrid 140 and conduct false data detection and mitigation, as explained in more detail below.

System 100 includes a central control system 150 structured to communicate with microgrid control systems 114, 124, 134, and 144, and perform global state estimation for system 100 using both raw measurements from the field devices of system 100 and aggregated local state estimations from each microgrid control system of system 100. In certain embodiments, central control system 150 is a distribution management system (DMS) or a distributed energy resource management system (DERMS).

Existing state estimation systems suffer from a number of shortcomings and disadvantages. There remain unmet needs including increasing the accuracy of false data detection, preventing erroneous execution of microgrid control commands, and increasing microgrid security. For instance, a cyber intruder may gain access to a single field device of a microgrid, causing malicious data to enter microgrid communication channels and adversely affect nested microgrids or the entire power network. Furthermore, a cyber intruder may be able to inject false data into a local or central control system which is undetectable by a single state estimator receiving a small number of measurements for state estimation. Central control system 150 and microgrid control systems 114, 124, 134, and 144 are structured to work simultaneously and in concert to detect false data entering the communication network of system 100 at any entry point of the communication system: at the field device, at the microgrid control system, or at the central control system. In order to briefly illustrate the advantages of the exemplary multi-layer state estimation, consider the following examples.

First, suppose cyber intruders inject false data into microgrid control system 114 indicating circuit breaker 118 is closed and also provide reasonable measurements to support the false circuit breaker status. If microgrid control system 114 used isolated local state estimation, it would be hard to detect false data since the false data injection included reasonable measurements and microgrid 110 includes a small number of field devices for generating state estimation input data. Using the exemplary false data detection algorithm described below, microgrid control system 114 can detect the false data by comparing its calculated topology to global state estimation calculated by central control system 150.

In a second example, central control system 150 generates a switching command based on false data received at central control system 150 in the form of a false data injection. The generated switching command would be effective to open circuit breaker 116. If microgrid 110 were operating in islanded mode at the time the switching command was executed, microgrid 110 would experience a blackout. Central control system 150 operating alone would not detect the false data. Using the exemplary false data detection process described below, microgrid control system 114 and central control system 150, working concurrently, will simulate the switching command and block the execution of the switching command. In certain embodiments, system 100 is structured to not only remove false data from measurements used in state estimation, but system 100 will also block the data source to prevent further cyberattacks on system 100. It shall be appreciated that any or all of the foregoing features of system 100 may also be present in the other nested microgrid systems disclosed herein.

Figure 2:
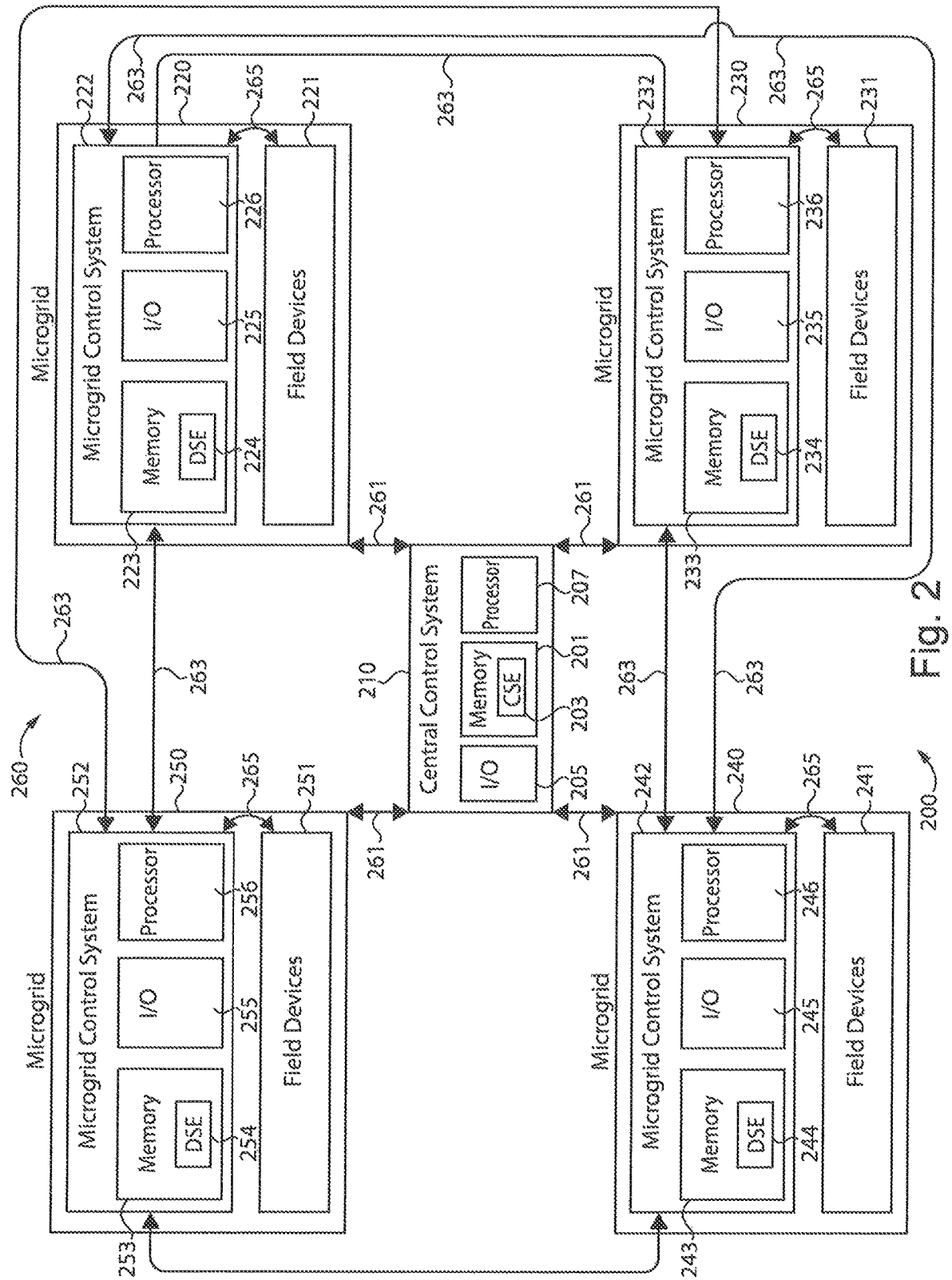
FIG. 2 is a block diagram illustrating an exemplary nested microgrid communication system.

With reference to FIG. 2, there is illustrated a nested microgrid system 200 including microgrids 220, 230, 240, and 250 and a central control system 210. Each microgrid includes a microgrid control system structured to communicate with other microgrid control systems by way of communication channels 263, the field devices of the same microgrid by way of communication channels 265, and central control system 210 by way of communication channels 261.

The communication channels of system 200 may transfer data by way of wired or wireless communication using communication protocols such as GOOSE, OPC UA, Pub-Sub, or DDS, to name but a few examples. In certain embodiments, some or all of the communication channels of system 200 include one or more software defined networking (SDN) devices, such as an Ethernet switch. For example, field devices 251 may each be coupled to a separate port of an SDN device, microgrid control system 253 may be coupled to a port of the SDN device, and the central control system 210 may be coupled to a port of the SDN device. In order for each field device to communicate, the SDN device must connect the port for the field device and the port for a control system. In certain embodiments, a microgrid control system or central control system 210 may block a false data injection from a field device by instructing the SDN device to disable the port of the field device. In certain embodiments, where a microgrid is experiencing multiple injections of false data, central control system 210 may instruct the SDN device to disconnect the port connecting the central control system 210 to the SDN device in order to isolate the affected microgrid control system. In certain embodiments, the SDN device may be used to control a field device before isolation of the field device, such as opening a circuit breaker with an IED.

Microgrid 220 includes a plurality of field devices 221 and a microgrid control system 222. Microgrid control system 222 includes a processing device 226, an input/output device 225, a memory device 223, and a distributed state estimator application 224. System 200 may be a stand-alone device, an embedded system, or a plurality of devices structured to perform the functions described with respect to system 222. For example, system 222 may be incorporated into a microgrid SCADA gateway.

Input/output device 225 enables microgrid control system 222 to communicate with the plurality of field devices 221, the other microgrids of system 200, and central control system 210. For example, input/output device 225 may include a network adapter, network credential, interface, or a port (e.g., a USB port, serial port, parallel port, an analog port, a digital port, VGA, DVI, HDMI, FireWire, CAT 5, Ethernet, fiber, or any other type of port or interface), to name but a few examples. Input/output device 225 may include more than one of these adapters, credentials, or ports, such as a first port for receiving data and a second port for transmitting data.

Processing device 226 may include one or multiple processors, Arithmetic-Logic Units (ALUs), Central Processing Units (CPUs), Digital Signal Processors (DSPs), or Field-programmable Gate Array (FPGA), to name but a few examples. For forms of processing device 226 with multiple processing units, distributed, pipelined, or parallel processing may be used. Processing device 226 may be dedicated to performance of only the operations described herein or may be used in one or more additional applications. Processing device 226 may be of a programmable variety that executes algorithms and processes data in accordance with distributed state estimator application 224 as defined by programming instructions (such as software or firmware) stored in memory 223. Alternatively or additionally, distributed state estimator application 224 for processing device 226 is at least partially defined by hardwired logic or other hardware. Processing device 226 may comprise one or more components of any type suitable to process the signals received from input/output device 225 or elsewhere, and provide desired output signals. Such components may include digital circuitry, analog circuitry, or a combination of both.

Memory device 223 may be of one or more types, such as a solid-state variety, electromagnetic variety, optical variety, or a combination of these forms, to name but a few examples. Furthermore, memory device 223 may be volatile, nonvolatile, transitory, non-transitory or a combination of these types, and some or all of memory device 223 may be of a portable variety, such as a disk, tape, memory stick, cartridge, to name but a few examples In addition, memory device 223 may store data that is manipulated by distributed state estimator application 224 of processing device 226, such as data representative of signals received from and/or sent to input/output device 225 in addition to or in lieu of storing programming instructions defining distributed state estimator application 224, just to name one example. It shall be appreciated that any or all of the foregoing features of microgrid control system 222 may also be present in the other control systems disclosed herein.

Microgrid 230 includes a microgrid control system 232 and a plurality of field devices 231. Microgrid control system 232 includes a memory device 233, an input/output device 235, and a processing device 236. A distributed state estimator application 234 is stored in memory device 233.

Microgrid 240 includes a microgrid control system 242 and a plurality of field devices 241. Microgrid control system 242 includes a memory device 243, an input/output device 245, and a processing device 246. A distributed state estimator application 244 is stored in memory device 243.

Microgrid 250 includes a microgrid control system 252 and a plurality of field devices 251. Microgrid control system 252 includes a memory device 253, an input/output device 255, and a processing device 256. A distributed state estimator application 254 is stored in memory device 253.

Central control system 210 includes a memory device 201, an input/output device 205, and a processing device 207. A centralized state estimator application 203 is stored in memory device 201. It shall be appreciated that any or all of the foregoing features of system 200 may also be present in the other nested microgrid systems disclosed herein.

Figure 3:
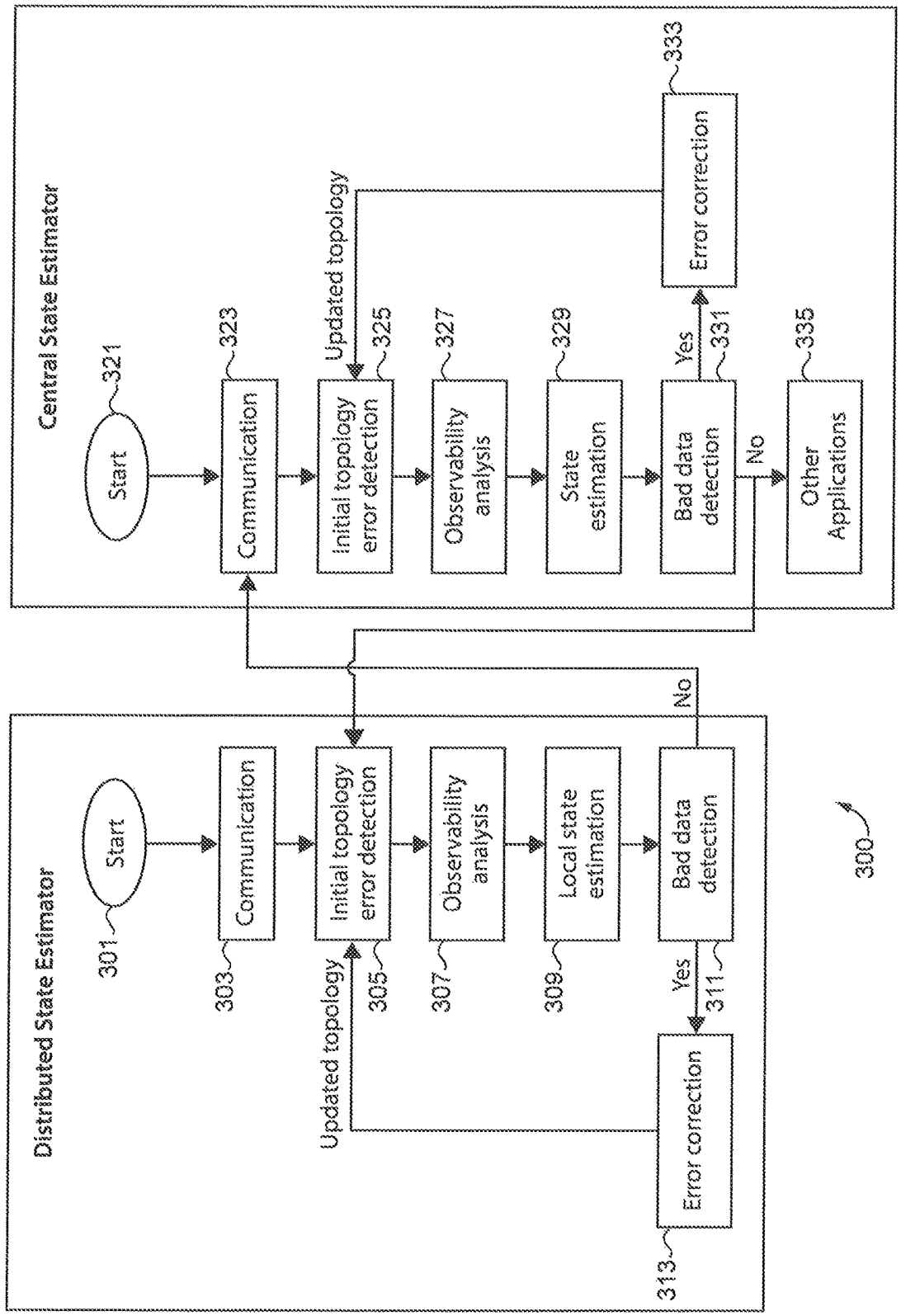
FIG. 3 is a flowchart illustrating an exemplary false data mitigation process.

With reference to FIG. 3, there is illustrated a process for detecting and mitigating false data in a nested microgrid system. The following description of process 300 is made with reference to nested microgrid system 100 illustrated in FIG. 1. Specifically, process 300 includes operations simultaneously executed by microgrid control system 114 and central control system 150. It is to be understood, however, that process 300 may be used in combination with other forms of nested microgrid systems, such as those described above with reference to FIG. 2. It shall be further appreciated that a number of variations and modifications to process 300 are contemplated including, for example, the omission of one or more aspects of process 300, the addition of further conditionals and operations and/or the reorganization or separation of operations and conditionals into separate processes.

The microgrid control system 114 portion of process 300 begins at start operation 301 and proceeds to operation 303 where microgrid control system 114 receives measurements from the field devices of microgrid 110. In certain embodiments, system 114 also receives calculated connection information from microgrid control systems of an adjacent microgrid, such as microgrid control systems 134 or 124. With respect to microgrid control system 134, the calculated connection information may include connection line 161 impedance, POI bus 131*a* voltage, tie breaker 162 switch status, or connection line 161 current, to name but a few examples. In certain embodiments, connection line impedance is known by microgrid control system 114 before process 300 begins.

Process 300 proceeds to operation 305 where microgrid control system 114 evaluates local topology using adjacent system information and local measurements received from the field devices of microgrid 110. Microgrid control system 114 may detect a topology error, such as incorrect switch statuses of tie breakers 162 and 164, as well as circuit breakers 116 and 118. For example, microgrid control system 114 uses the following equation to estimate the POI bus voltage of an adjacent microgrid, such as the voltage of bus 131*a*, where $V_m^{POI}$ is the estimated voltage of bus 131*a*, $V_n^{POI}$ is the measured voltage of POI bus 111*a*, $I_{n-m}$ is the current flowing through connection line 161, and $Z_{n-m}$ is the impedance of line 161 between POI bus 111*a* and POI bus 131*a*.

$$V_m^{POI} = V_n^{POI} + (I_{n-m} \times Z_{n-m}) \quad (1)$$

It shall be appreciated that an estimated voltage may include a magnitude, a phase angle, or both. Once the voltage of bus 131*a* is estimated, system 114 compares the estimate to an estimated value of bus 131*a* voltage received from central control system 150, which may be based on aggregated measurements or an estimate calculated by central control system 150. Microgrid control system 114 determines there is a topology error if the estimate calculated by microgrid control system 114 and the estimate of bus 131*a* voltage received from central control system 150 do not match, such as differing by more than 5%, to name one example. A topology error may be caused by false data due to a sensor error, communication noise, or cyberattack. False data injection may occur at a field device, at microgrid 110 or at central control system 150. For example, a cyber intruder could close breaker 162 while injecting false data to microgrid control system 114 purporting to be measurements from sensor 113*a* indicating breaker 162 is still open.

For detecting internal topology errors, microgrid control system 114 continues to estimate bus voltage for all buses of microgrid 110, such as buses 111*b* and 111*c* using equation (1). Microgrid control system 114 compares an estimated value of a bus to the measured value of a bus to determine if there is a topology error in the switch status of circuit breaker 116 or 118.

In addition to microgrid control system 114 detecting and updating topology, microgrid control system 114 will also receive topology information from central control system 150 to correct topology error. System 114, in response, will replace the false switch status with the correct status received from central control system 150.

Process 300 proceeds to operation 307 where microgrid control system 114 performs observability analysis to determine whether there are sufficient measurements, including pseudo measurements, to perform state estimation. Specifically, observability analysis includes verifying whether the number and location of measurements from field devices of microgrid 110 will allow a set of state estimated variables to be calculated. Additional pseudo measurements may be calculated using local measurements to increase the accuracy of future operations. Any type of observability analysis may be performed, including topological or numerical techniques, pseudo-measurement determination problems, or Gaussian elimination to calculate the null space of the Jacobian matrix, to name but a few examples.

Once microgrid control system 114 determines there are sufficient measurements to perform state estimation, process 300 proceeds to operation 309 where microgrid control system 114 performs local state estimation. If the measurements to be used are synchronized, such as by a time stamp, linear state estimation is used. Otherwise, nonlinear state estimation is used. State estimation may be performed using the following equation, where z is a measurement vector including all bus measurements, current measurements, and pseudo measurements; H is a matrix including the microgrid topology; x is a state vector including estimated bus voltage magnitudes and angle; and e is a measurement error vector.

$$z = Hx + e \quad (2)$$

Process 300 proceeds to operation 311 where measurements errors, also known as false data, are detected by microgrid control system 114 using the local state estimation from operation 309 and global state estimation performed by central control system 150. As with topology errors, measurement errors may be caused by sensor errors, communication network errors, or cyber intrusions. For example, measurement errors may be caused by instrument transformer errors, communication network failure or unexpected noise, or false data injection attacks, to name but a few examples. Microgrid control system 114 compares the local state estimation and the global state estimation to detect false data. Techniques to compare the local state estimation and the global state estimation include, but are not limited to, Chi-square distribution, normalized residuals, or hypothesis testing identification.

Process 300 proceeds to operation 313 where detected false data is removed from the set of local measurements used by operations 305 to 309. In certain embodiments, microgrid control system 114 may also transmit an alarm in response to detected false data, block future measurements purporting to be from the same purported source as the false data, or isolate the source of the false data using software defined networking techniques, to name but a few examples. Process 300 then returns to operation 305 and performs operations 305 through 309 with the false data removed. Once process 300 returns to operation 311, microgrid control system 114 will transmit the updated local state estimation to central control system 150 as long as no additional false data is detected.

The central control system 150 portion of process 300 beings at start operation 321 and proceeds to operation 323 where central control system 150 receives periodically polled data from all microgrids of system 100, including measurements from the field devices of microgrids 110, 120, 130, and 140. Field device measurements may be transmitted directly to central control system 150 or by way of the microgrid control systems. Central control system 150 also receives the local state estimation from each microgrid.

Process 300 proceeds to operation 325 where central control system 150 detects system topology errors. First, central control system 150 uses equation (1) to calculate a system topology with the periodically polled measurements from the field devices of all microgrids as input variables. Next, central control system 150 uses equation (1) to calculate a system topology with the local state estimations as input variables. The two calculated system topologies are compared as in operation 305 to determine whether topology errors exist and need correction. Once the topology is updated, the corrected topology is transmitted to each microgrid.

Process 300 proceeds to operation 327 where central control system 150 performs observability analysis to determine whether the number and locations of measurements received in operation 323 and pseudo measurements are sufficient to perform state estimation.

Once central control system 150 determines there are sufficient measurements to perform state estimation, process 300 proceeds to operation 329 where central control system 150 generates two sets of state estimations using equation (2). First, central control system 150 uses all the local state estimations received from each microgrid to perform state-based global state estimation. Second, central control system 150 uses the raw measurements received from the field devices to perform measurement-based global state estimation.

Process 300 proceeds to operation 331 where central control system 150 detects false data by comparing the state based global state estimation and the measurement based global state estimation. Discrepancies between the two global state estimations indicate false data. Techniques to compare the global state estimations include, but are not limited to Chi-square distribution, normalized residuals, or hypothesis testing identification.

If false data is detected, process 300 proceeds to operation 333 where detected false data is removed from the set of measurements used by operations 325 to 329. In certain embodiments, central control system 150 may also transmit an alarm in response to detected false data, block future measurements purporting to be from the same purported source as the false data, or isolate the source of the false data using software defined networking techniques, to name but a few examples. Process 300 then returns to operation 325 where the updated global state estimation is used to performs operations 325 through 329 with the false data removed.

After process 300 re-executes operation 331 without detecting false data, process 300 proceeds to operation 335 where central control system 150 transmits the updated global state estimation to other applications for analysis. Central control system 150 may transmit either the global state estimation calculated using the raw measurements, the global state estimation calculated using the local state estimations, or a combination thereof. Global state estimation may be used by other applications for market simulations, stability analysis, and demand response, to name but a few examples. Process 300 may be repeated every time a new measurement is received from a field device or a set of new measurements are received from a set of field devices. Process 300 may also be repeated after a time interval. For example, process 300 may be repeated every 10 seconds for microgrid systems without PMUs, or 50 times per second for microgrid systems including PMUs.

Figure 4:
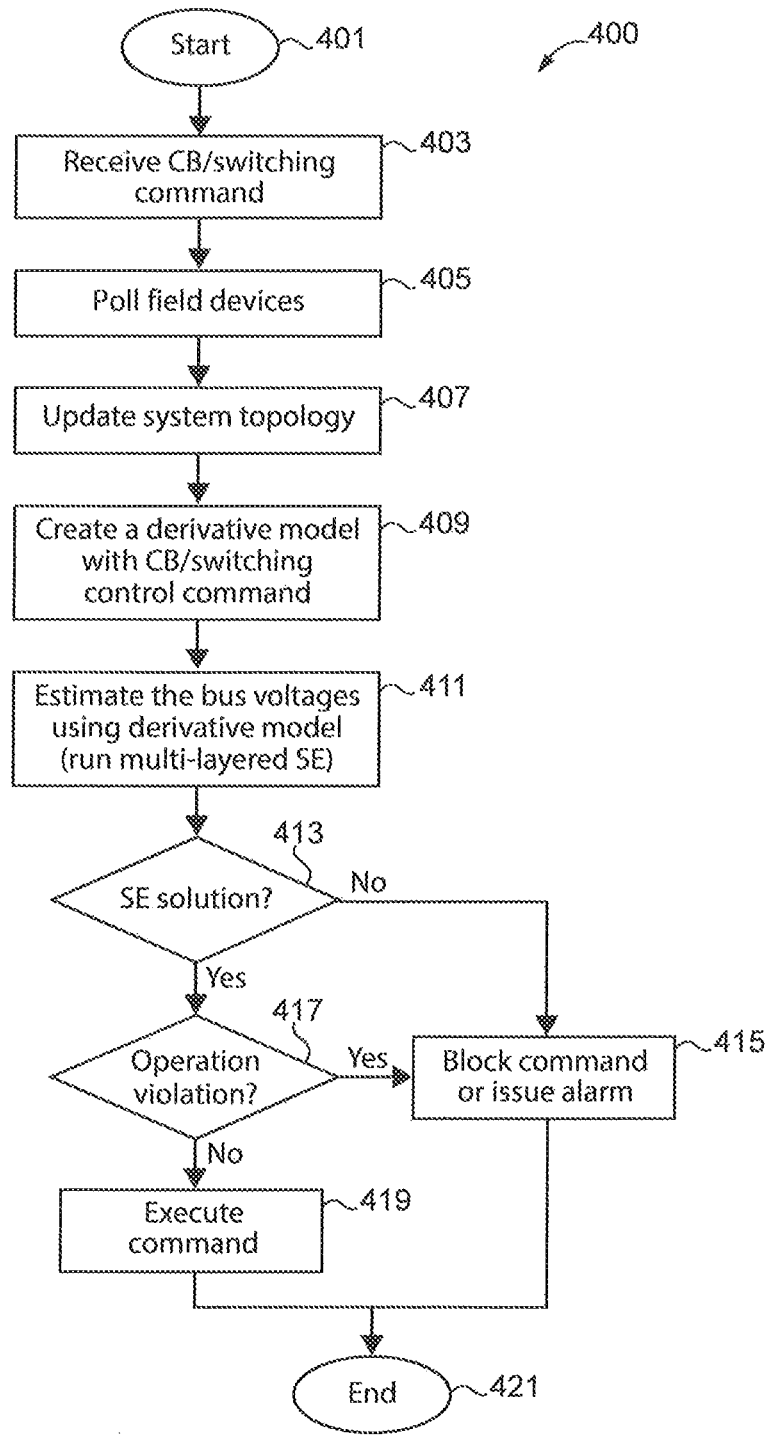
FIG. 4 is a flowchart illustrating an exemplary switch command verification process incorporating the exemplary false data mitigation process of FIG. 3.

With reference to FIG. 4, there is illustrated an exemplary process 400 for multi-layer predictive analysis of switching commands in a nested microgrid system using multi-layer state estimation. The following description of process 400 is made with reference to nested microgrid system 100 illustrated in FIG. 1. It is to be understood, however, that process 400 may be used in combination with other forms of nested microgrid systems. It shall be further appreciated that a number of variations and modifications to process 400 are contemplated including, for example, the omission of one or more aspects of process 400, the addition of further conditionals and operations and the reorganization or separation of operations and conditionals into separate processes.

Process 400 begins at start operation 401 and proceeds to operation 403 where microgrid control system 114 receives a switching command to operate a circuit breaker in microgrid 110, such as closing circuit breaker 118. A switching command may be received from central control system 150, such as a DMS or DERMS, to name but a few examples.

Process 400 proceeds to operation 405 where microgrid control system 114 polls field devices for data including updated measurements and switch statuses. Process 400 proceeds to operation 407 where microgrid control system 114 updates the system topology using the polled data received in operation 405 as described with respect to operation 305 in FIG. 3. Process 400 proceeds to operation 409 where microgrid control system 114 modifies the system topology updated in operation 407 based on the received switching command. For example, if the switching command included closing circuit breaker 118, the system topology is updated to indicate circuit breaker 118 as closed.

Process 400 proceeds to operation 411 where microgrid control system 114 and central control system 150 perform multi-layer state estimation as described with respect to operations 309 and 329 in FIG. 3. Microgrid control system 114 performs local state estimation and compares the local state estimation to the global state estimation received from central control system 150.

Process 400 proceeds to conditional 413 where microgrid control system 114 determines whether a solution of the state estimation can be obtained, i.e. whether state estimation produced converged results. If the state estimation cannot converge during the simulation of the new switching command, the simulation indicates system 100 could experience a voltage collapse if the switching command were executed. Therefore, process 400 will proceed to operation 415 if a solution cannot be obtained. At operation 415 the switching command is not executed, an alarm is issued to central control system 150 or a substation operator, or the source of the switching command is identified and isolated using software defined network techniques. Process then proceeds to end operation 421.

With continuing reference to conditional 413, if the state estimation does converge, process 400 proceeds to conditional 417 where microgrid control system 114 determines whether the simulation indicates a voltage limit violation. If the simulation indicates the switching command would generate an overvoltage condition on one of the buses of system 100 causing circuit breakers to trip, process 400 proceeds to operation 415. If the simulation indicates the switching command would generate an undervoltage condition on one of the buses of system 100 causing load shedding, process proceeds to operation 415. If microgrid control system 114 cannot detect any problem caused by the switching command using the simulated state estimation, process 400 proceeds to operation 423, where the switching command is executed. Process 400 then proceeds to end operation 421.

It is contemplated that the various aspects, features, processes, and operations from the various embodiments may be used in any of the other embodiments unless expressly stated to the contrary. Certain operations illustrated may be implemented by a computer executing a computer program product on a non-transient, computer-readable storage medium, where the computer program product includes instructions causing the computer to execute one or more of the operations, or to issue commands to other devices to execute one or more operations.

Further written description of a number of exemplary embodiments shall now be provided. One embodiment is a method for removing false data in a nested microgrid system, the method comprising: calculating, with a first microgrid control system of a first microgrid, a first local state estimation using a first plurality of local measurements; calculating, with a second microgrid control system of a second microgrid, a second local state estimation using a second plurality of local measurements; calculating, with a central control system, a plurality of global state estimations including a first global state estimation using the first plurality of measurements and the second plurality of measurements, and a second global state estimation using the first local state estimation and the second local state estimation; performing, with the first microgrid control system, a first false data detection test using the first local state estimation and one global state estimation of the plurality of global state estimations; performing, with the central control system, a second false data detection test using the first global state estimation and the second global state estimation; detecting false data in response to performing the first false data detection test or the second false data detection test; and updating the first global state estimation, the second global state estimation, or the first local state estimation in response to detecting the false data.

In some examples of the foregoing method, the first microgrid includes a first plurality of field devices structured to generate the first plurality of local measurements corresponding to physical or electrical characteristics of the first microgrid, and wherein the second microgrid includes a second plurality of field devices structured to generate the second plurality of local measurements corresponding to physical or electrical characteristics of the second microgrid. In some examples, false data is detected in response to performing the first false data detection test, and wherein updating in response to detecting the false data includes determining, with the first microgrid control system, the first local state estimation includes false data, recalculating, with the first microgrid control system, the local state estimation without the false data, and transmitting the recalculated local state estimation to the central control system. In some examples, false data is detected in response to performing the second false data detection test, and wherein updating in response to detecting the false data includes determining, with the central control system, the first local state estimation includes false data, recalculating, with the central control system, the plurality of global states estimations without the false data, and transmitting one recalculated global state estimation to the central control system. In some examples, the method comprises generating, with the first microgrid control system, a first microgrid topology using the first plurality of measurements; generating, with the central microgrid control system, a system topology using the first plurality of measurements and the second plurality of measurements; detecting, with the first microgrid control system, a topology error in response to comparing the system topology error and the first microgrid topology; and updating the first microgrid topology in response to detecting the topology error. In some examples, the method comprises receiving a switch command with the first microgrid control system; and generating, with the first microgrid control system, a simulated microgrid topology, wherein calculating the local state estimation includes using the simulated microgrid topology, and wherein detecting false data includes determining the received switch command would cause a voltage collapse or a voltage limit violation. In some examples, the method comprises determining a source of the false data; and preventing false data from being introduced into future state estimations. In some examples, preventing false data from being introduced into future state estimations includes transmitting an alarm to a system operation or blocking data received from the determined source of the false data. In some examples, the false data includes data injected by a cyber intruder and the determined source of the false data is a field device, the first microgrid control system, or the central control system. In some examples, a first plurality of field devices and the first microgrid control system are structured to communicate by way of a software defined networking (SDN) controller and wherein preventing false data from being introduced into future state estimations includes transmitting a command to the SDN controller effective to disable communication by the determined source of the false data. In some examples, the first microgrid includes a circuit breaker, and wherein preventing false data from being introduced into future state estimations includes toggling the circuit breaker with the SDN controller before disabling communication by the determined source of false data. In some examples, the first plurality of measurements includes a voltage magnitude and phase angle for a first plurality of buses of the first microgrid and the second plurality of measurements includes a voltage magnitude and phase angle for a second plurality of buses of the second microgrid.

Another exemplary embodiment is a method for mitigating a false switching command in a nested microgrid system including a first microgrid, the method comprising: receiving, with a first microgrid control system of the first microgrid, a switching command effective to toggle a controllable switch of the first microgrid; generating, with the first microgrid control system, a simulated microgrid topology using a first plurality of measurements; generating, with a central control system, a simulated system topology using a first plurality of measurements and a second plurality of measurements from a second microgrid; calculating, with a first microgrid control system of a first microgrid, a first local state estimation using the simulated microgrid topology; calculating, with the central control system, a plurality of global state estimations including a first global state estimation using simulated system topology, and a second global state estimation using the first local state estimation; performing, with the first microgrid control system, a first false data detection test by comparing the first local state estimation and one global state estimation of the plurality of global state estimations; performing, with the second microgrid control system, a second false data detection test by comparing the first global state estimation and the second global state estimation; determining the switching command includes false data in response to performing the first false data detection test or the second false data detection test; and ignoring, with the first microgrid control system, the received switch command. In some examples, the first microgrid includes a first plurality of field devices structured to generate the first plurality of local measurements corresponding to physical or electrical characteristics of the first microgrid, and wherein the second microgrid includes a second plurality of field devices structured to generate the second plurality of local measurements corresponding to physical or electrical characteristics of the second microgrid. In some examples, determining the switching command includes false data includes determining that execution of the switching command would cause a voltage collapse on the first microgrid. In some examples, determining the switching command includes false data includes determining that execution of the switching command would cause an over voltage condition or and under voltage condition on the first microgrid. In some examples, a first plurality of field devices, the first microgrid control system, and the central control system are structured to communicate by way of a software defined networking (SDN) controller and wherein ignoring the received switch command includes transmitting a command to the SDN controller effective to disable communication from one field device of the first plurality of field devices, the first microgrid, or the central control system. In some examples, the first microgrid includes a circuit breaker, and wherein preventing false data from being introduced into future state estimations includes toggling the circuit breaker with the SDN controller before disabling communication. In some examples, the switching command is received from the central control system, and wherein the central control system generated the switching command using false data cause by a cyber intruder, a faulty sensor, or signal noise. In some examples, ignoring the switching command includes blocking a source of the switching command or alerting a system operator.

For the purposes of clearly, concisely and exactly describing non-limiting exemplary embodiments of the disclosure, the manner and process of making and using the same, and to enable the practice, making and use of the same, reference has been made to certain exemplary embodiments, including those illustrated in the figures, and specific language has been used to describe the same. It shall nevertheless be understood that no limitation of the scope of the present disclosure is thereby created, and that the present disclosure includes and protects such alterations, modifications, and further applications of the exemplary embodiments as would occur to one skilled in the art with the benefit of the present disclosure.

While the present disclosure has been illustrated and described in detail in the drawings and foregoing description, the same is to be considered as illustrative and not restrictive in character, it being understood that only certain exemplary embodiments have been shown and described, and that all changes and modifications that come within the spirit of the present disclosure are desired to be protected. It should be understood that while the use of words such as "preferable," "preferably," "preferred" or "more preferred" utilized in the description above indicate that the feature so described may be more desirable, it nonetheless may not be necessary, and embodiments lacking the same may be contemplated as within the scope of the present disclosure, the scope being defined by the claims that follow. In reading the claims, it is intended that when words such as "a," "an," "at least one," or "at least one portion" are used there is no intention to limit the claim to only one item unless specifically stated to the contrary in the claim. The term "of" may connote an association with, or a connection to, another item, as well as a belonging to, or a connection with, the other item as informed by the context in which it is used. The terms "coupled to," "coupled with" and the like include indirect connection and coupling, and further include but do not require a direct coupling or connection unless expressly indicated to the contrary. When the language "at least a portion" and/or "a portion" is used, the item can include a portion and/or the entire item unless specifically stated to the contrary.

What is claimed is:

1. A method for removing false data in a nested microgrid system that includes a first microgrid control system of a first microgrid, a second microgrid control system of a second microgrid, and a central control system, the first microgrid including a circuit breaker, the method comprising:
    calculating, by the first microgrid control system of the first microgrid, a first local state estimation using a first plurality of raw local measurements;
    calculating, by the second microgrid control system of the second microgrid, a second local state estimation using a second plurality of raw local measurements;
    receiving, by the central control system, the first plurality of raw local measurements either directly from a first plurality of field devices in the first microgrid, or from the first plurality of field devices by way of the first microgrid control system, the first plurality of field devices and the first microgrid control system communicating by way of a software defined networking (SDN) controller;
    receiving, by the central control system, the second plurality of raw local measurements either directly from a second plurality of field devices in the second microgrid, or from the second plurality of field devices by way of the second microgrid control system;
    calculating, by the central control system, a plurality of global state estimations, including a first global state estimation using the received first plurality of raw local measurements and the received second plurality of raw local measurements, and a second global state estimation using the first local state estimation and the second local state estimation, the first and second global state estimations being calculated using different types of input data, the first and second pluralities of raw local measurements being a first type of the input data, and the first and second local state estimations being a second type of the input data;
    performing, by the first microgrid control system, a first false data detection test by comparing the first local state estimation and one global state estimation of the plurality of global state estimations;
    performing, by the central control system, a second false data detection test by comparing the first global state estimation and the second global state estimation;
    detecting the false data in response to performing the first false data detection test or performing the second false data detection test;
    updating the first global state estimation, the second global state estimation, or the first local state estimation in response to detecting the false data;
    determining a source of the false data; and
    preventing the false data from being introduced into future state estimations, the preventing the false data from being introduced into the future state estimations comprising:
        toggling the circuit breaker with the SDN controller; and
        after the toggling the circuit breaker, transmitting a command to the SDN controller effective to disable communication by the determined source of the false data.

2. The method of claim 1, wherein the first plurality of field devices are structured to generate the first plurality of raw local measurements corresponding to physical or electrical characteristics of the first microgrid, and the second plurality of field devices are structured to generate the second plurality of raw local measurements corresponding to physical or electrical characteristics of the second microgrid.

3. The method of claim 1, wherein the false data is detected in response to performing the first false data detection test, and updating in response to detecting the false data comprises determining, by the first microgrid control system, the first local state estimation includes the false data, recalculating, by the first microgrid control system, a third local state estimation without the false data, and transmitting the third local state estimation to the central control system.

4. The method of claim 1, wherein the false data is detected in response to performing the second false data detection test, and updating in response to detecting the false data comprises determining, by the central control system, the first local state estimation includes the false data, recalculating, by the central control system, the plurality of global state estimations without the false data, and transmitting one recalculated global state estimation to the central control system.

5. The method of claim 1, further comprising:
generating, by the first microgrid control system, a first microgrid topology using the first plurality of raw local measurements;
generating, by the central control system, a system topology using the first plurality of raw local measurements and the second plurality of raw local measurements;
detecting, by the first microgrid control system, a topology error in response to comparing the system topology and the first microgrid topology; and
updating the first microgrid topology in response to detecting the topology error.

6. The method of claim 1, further comprising:
receiving a switch command by the first microgrid control system; and
generating, by the first microgrid control system, a simulated microgrid topology,
the calculating the first local state estimation comprising using the simulated microgrid topology, and
the detecting the false data comprising determining the received switch command would cause a voltage collapse or a voltage limit violation.

7. The method of claim 1, wherein preventing the false data from being introduced into the future state estimations further comprises transmitting an alarm to a system operation or blocking data received from the determined source of the false data.

8. The method of, claim 1 wherein the false data includes data injected by a cyber intruder and the determined source of the false data is a field device, the first microgrid control system, or the central control system.

9. The method of claim 1, wherein the first plurality of raw local measurements includes a voltage magnitude and phase angle for a first plurality of buses of the first microgrid and the second plurality of raw local measurements includes a voltage magnitude and phase angle for a second plurality of buses of the second microgrid.

10. The method of claim 1, wherein preventing the false data from being introduced into the future state estimations further comprises disconnecting a port within the nested microgrid system to isolate a portion of the nested microgrid system affected by the false data.

11. The method of claim 1, wherein preventing the false data from being introduced into the future state estimations further comprises blocking future measurements purporting to be from the determined source of the false data.

12. A method for mitigating a false switching command in a nested microgrid system that includes a first microgrid and a central control system, the first microgrid including a circuit breaker, the method comprising:
receiving, by a first microgrid control system of the first microgrid, a switching command effective to toggle a controllable switch of the first microgrid;
generating, by the first microgrid control system, a simulated microgrid topology using a first plurality of raw local measurements;
receiving, by the central control system, the first plurality of raw local measurements either directly from a first plurality of field devices in the first microgrid, or from the first plurality of field devices by way of the first microgrid control system, the first plurality of field devices, the first microgrid control system, and the central control system communicating by way of a software defined networking (SDN) controller;
receiving, by the central control system, a second plurality of raw local measurements either directly from a second plurality of field devices in a second microgrid, or from the second plurality of field devices by way of a second microgrid control system in the second microgrid;
generating, by the central control system, a simulated system topology using the first plurality of raw local measurements and the second plurality of raw local measurements;
calculating, by the first microgrid control system of the first microgrid, a first local state estimation using the simulated microgrid topology;
calculating, by the central control system, a plurality of global state estimations, including a first global state estimation using the simulated system topology, and a second global state estimation using the first local state estimation, the first and second global state estimations being calculated using different types of input data, the simulated system topology being a first type of the input data, and the first local state estimation being a second type of the input data;
performing, by the first microgrid control system, a first false data detection test by comparing the first local state estimation and one global state estimation of the plurality of global state estimations;
performing, by the central control system, a second false data detection test by comparing the first global state estimation and the second global state estimation;
determining the received switching command includes false data in response to performing the first false data detection test or the second false data detection test;
determining a source of the false data;
preventing the false data from being introduced into future state estimations, the preventing the false data from being introduced into the future state estimations comprising toggling the circuit breaker with the SDN controller; and
after the preventing the false data from being introduced into the future state estimations, ignoring, by the first microgrid control system, the received switching command, the ignoring the received switching command comprising transmitting a first command to the SDN controller effective to disable communication from one field device of the first plurality of field devices, the first microgrid, or the central control system.

13. The method of claim 12, wherein the first plurality of field devices are structured to generate the first plurality of raw local measurements corresponding to physical or electrical characteristics of the first microgrid, and the second plurality of field devices are structured to generate the second plurality of raw local measurements corresponding to physical or electrical characteristics of the second microgrid.

14. The method of claim 12, wherein determining the received switching command includes the false data comprises determining that execution of the received switching command would cause a voltage collapse on the first microgrid.

15. The method of claim 12, wherein determining the received switching command includes the false data comprises determining that execution of the received switching command would cause an over voltage condition or an under voltage condition on the first microgrid.

16. The method of claim 12, wherein the received switching command is received from the central control system, and the central control system generates the received switching command using the false data caused by a cyber intruder, a faulty sensor, or signal noise.

17. The method of claim 12, wherein ignoring the received switching command further comprises blocking a source of the received switching command or alerting a system operator.

18. A nested microgrid system, comprising:
a first microgrid comprising a first circuit breaker, and comprising a first microgrid control system comprising:
 a first non-transitory memory comprising instructions; and
 a first one or more processors in communication with the first non-transitory memory;
a second microgrid comprising a second microgrid control system comprising:
 a second non-transitory memory comprising instructions; and
 a second one or more processors in communication with the second non-transitory memory; and
a central control system comprising:
 a third non-transitory memory comprising instructions; and
 a third one or more processors in communication with the third non-transitory memory;
wherein during a first time:
 the first one or more processors executes the instructions to calculate a first local state estimation using a first plurality of raw local measurements;
 the second one or more processors executes the instructions to calculate a second local state estimation using a second plurality of raw local measurements;
 the third one or more processors executes the instructions to:
  receive the first plurality of raw local measurements either directly from a first plurality of field devices in the first microgrid, or from the first plurality of field devices by way of the first microgrid control system, wherein the first plurality of field devices and the first microgrid control system are structured to communicate by way of a software defined networking (SDN) controller;
  receive the second plurality of raw local measurements either directly from a second plurality of field devices in the second microgrid, or from the second plurality of field devices by way of the second microgrid control system; and
  calculate a plurality of global state estimations, including a first global state estimation using the first plurality of raw local measurements and the second plurality of raw local measurements, and a second global state estimation using the first local state estimation and the second local state estimation, wherein the first and second global state estimations are calculated using different types of input data, wherein the first and second pluralities of raw local measurements are a first type of the input data, and wherein the first and second local state estimations are a second type of the input data;
wherein during a second time:
 the first one or more processors executes the instructions to compare the first local state estimation and one of the plurality of global state estimations;
 the second one or more processors executes the instructions to compare the second local state estimation and one of the plurality of global state estimations;
 at least one of the first or second one or more processors executes the instructions to detect false data at the respective microgrid based on the respective comparison; and
 the third one or more processors executes the instructions to compare the first global state estimation and the second global state estimation and, based thereon, detect the false data; and
wherein during a third time at least one of the first or second one or more processors executes the instructions to prevent the false data from being introduced into future state estimations, comprising the at least one of the first or second one or more processors executing the instructions to:
 toggle the first circuit breaker with the SDN controller; and
 after the toggle, transmit a command to the SDN controller effective to disable communication by a determined source of the false data; and
 modify a status of circuit breakers in the nested microgrid system based on the detected false data.

* * * * *

UNITED STATES PATENT AND TRADEMARK OFFICE
CERTIFICATE OF CORRECTION

| | | |
|---|---|---|
| PATENT NO. | : 12,149,070 B2 | Page 1 of 1 |
| APPLICATION NO. | : 16/147979 | |
| DATED | : November 19, 2024 | |
| INVENTOR(S) | : Junho Hong et al. | |

It is certified that error appears in the above-identified patent and that said Letters Patent is hereby corrected as shown below:

On the Title Page

Item (73), In the Assignee insert -- ABB SCHWEIZ AG --

Signed and Sealed this
First Day of July, 2025

Coke Morgan Stewart
*Acting Director of the United States Patent and Trademark Office*